US011555861B2

(12) United States Patent
Kondo et al.

(10) Patent No.: US 11,555,861 B2
(45) Date of Patent: Jan. 17, 2023

(54) LOAD TESTING DEVICE

(71) Applicant: TATSUMI RYOKI CO., LTD, Tokyo (JP)

(72) Inventors: Toyoshi Kondo, Tokyo (JP); Nobuhide Hamano, Tokyo (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 0 days.

(21) Appl. No.: 17/621,111

(22) PCT Filed: Jul. 7, 2020

(86) PCT No.: PCT/JP2020/026528
§ 371 (c)(1),
(2) Date: Dec. 20, 2021

(87) PCT Pub. No.: WO2021/020044
PCT Pub. Date: Feb. 4, 2021

(65) Prior Publication Data
US 2022/0349952 A1 Nov. 3, 2022

(30) Foreign Application Priority Data

Aug. 1, 2019 (JP) .............................. JP2019-142093

(51) Int. Cl.
G01R 31/40 (2020.01)
G01R 31/42 (2006.01)
(Continued)

(52) U.S. Cl.
CPC ................ G01R 31/42 (2013.01); C01B 3/00 (2013.01); C25B 1/04 (2013.01); C25B 9/65 (2021.01);
(Continued)

(58) Field of Classification Search
CPC .. G01R 31/42; G01R 31/40; G01R 31/31721; C01B 3/00; C25B 1/04; C25B 9/65;
(Continued)

(56) References Cited

U.S. PATENT DOCUMENTS

2014/0021785 A1* 1/2014 Munier ..................... H02J 3/32
307/25
2017/0192121 A1* 7/2017 Miles ..................... G01V 3/102
(Continued)

FOREIGN PATENT DOCUMENTS

JP 2005-137101 A 5/2005
JP 2005-159286 A 6/2005
(Continued)

OTHER PUBLICATIONS

International Search Report issued in PCT/JP2020/026528 dated Sep. 15, 2020 with English Translation (5 pages).
(Continued)

Primary Examiner — Raul J Rios Russo
(74) Attorney, Agent, or Firm — Nakanishi IP Associates, LLC

(57) ABSTRACT

A load testing device includes a connection unit to which a power source being tested is connected, a hydrogen generating unit that performs electrolysis based on power supplied from the power source being tested to generate hydrogen, two or more supply units to which hydrogen obtained in the hydrogen generating unit passes and to which a portable tank is removably attached, and an operational unit that has a load amount adjustment switch and a display unit. The load amount of the hydrogen generating unit is switched depending on an operational state of the load amount adjustment switch. The display unit displays at least one of an attachment status of the portable tank and a filling status of hydrogen in the two or more supply units.

9 Claims, 5 Drawing Sheets

(51) Int. Cl.
  *C25B 9/65* (2021.01)
  *C01B 3/00* (2006.01)
  *C25B 1/04* (2021.01)
  *C25B 15/08* (2006.01)
  *G01R 31/317* (2006.01)
  *H02S 50/10* (2014.01)
  *H02S 50/00* (2014.01)
  *H02S 99/00* (2014.01)

(52) U.S. Cl.
  CPC ........ *C25B 15/08* (2013.01); *G01R 31/31721* (2013.01); *G01R 31/40* (2013.01); *H02S 50/00* (2013.01); *H02S 50/10* (2014.12); *H02S 99/00* (2013.01)

(58) Field of Classification Search
  CPC ......... C25B 15/08; H02S 50/10; H02S 50/00; H02S 99/00
  USPC ......... 324/71, 378, 403, 415, 425, 500, 537, 324/764.01
  See application file for complete search history.

(56) References Cited

U.S. PATENT DOCUMENTS

| | | | |
|---|---|---|---|
| 2017/0235010 A1* | 8/2017 | Olsson | G01V 3/104 324/326 |
| 2019/0317148 A1 | 10/2019 | Kondo | |
| 2020/0217277 A1* | 7/2020 | Chalitaporn | F02D 19/0697 |
| 2021/0116595 A1* | 4/2021 | Deng | G01V 3/10 |

FOREIGN PATENT DOCUMENTS

| | | |
|---|---|---|
| JP | 2012-054385 A | 3/2012 |
| JP | 2017-008382 A | 1/2017 |
| WO | 2015/004827 A1 | 1/2015 |
| WO | 2018/211574 A1 | 11/2018 |

OTHER PUBLICATIONS

Notification of Reasons for Refusal issued in Japanese Patent Application No. 2020-552419 dated Nov. 10, 2020 with English Translation (6 pages).

Decision to Grant Patent issued in Japanese Patent Application No. 2020-552419 dated Dec. 11, 2020, with English Translation (5 pages).

* cited by examiner

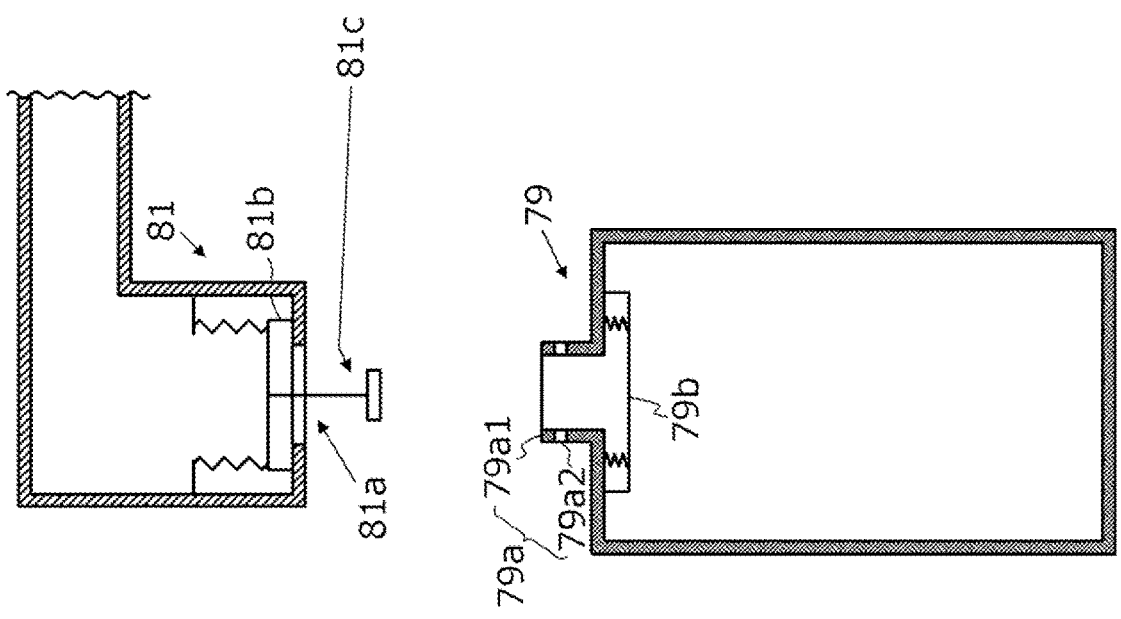

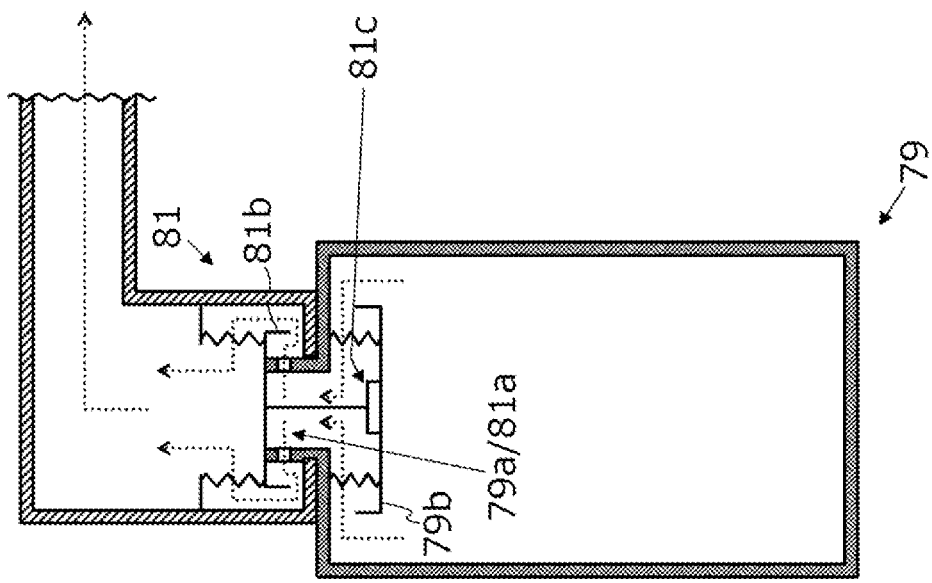

LOAD TESTING DEVICE

TECHNICAL FIELD

The present invention relates to a load testing device.

BACKGROUND ART

Conventionally, as in Patent Literature 1, a load testing device using electrolysis of water has been proposed.

CITATION LIST

Patent Literature

Patent Literature 1: JP 2005-159286 A

SUMMARY OF INVENTION

Technical Problems

However, efficient storage of generated hydrogen is not considered.

Therefore, an object of the present invention is to provide a load testing device capable of efficiently storing generated hydrogen.

Solution to Problem

A load testing device according to the present invention includes a connection unit to which a power source being tested is connected, a hydrogen generating unit that performs electrolysis based on power supplied from the power source being tested to generate hydrogen, two or more supply units to which hydrogen obtained in the hydrogen generating unit passes and to which a portable tank is removably attached, and an operational unit that has a load amount adjustment switch and a display unit. The load amount of the hydrogen generating unit is switched depending on an operational state of the load amount adjustment switch. The display unit displays at least one of an attachment status of the portable tank and a filling status of hydrogen in the two or more supply units.

It is possible to generate hydrogen and fill the portable tank with hydrogen while performing the load test of the power source being tested.

A supply status of hydrogen such as a flow rate and a pressure in a pipe upstream of the plurality of supply units, the attachment status of the portable tank in the plurality of supply units, the filling status of hydrogen, and the like are output to the display unit of the operational unit.

For this reason, a user can grasp information regarding these while operating the load test.

In addition, since the plurality of supply units to which the portable tank is removably attached is provided, it is possible to fill the plurality of portable tanks with hydrogen at the same time. In addition, regarding the portable tank attached to the supply unit, it is also possible to replace one portable tank with a new portable tank while filling hydrogen in another portable tank.

In addition, it is possible to fill a large capacity of hydrogen by using a plurality of portable tanks having a small capacity.

When the capacity of the portable tank is small, it is possible to easily manufacture the portable tank having specifications conforming to the regulation as compared with the case of using a portable tank having a large capacity.

Therefore, it is possible to efficiently fill the portable tank with hydrogen generated in the load test.

Preferably, the load testing device further includes a compressor that operates based on power from the power source being tested and compresses the hydrogen obtained in the hydrogen generating unit. The hydrogen made to a high pressure state by the compressor is supplied to the two or more supply units.

Power supplied from the power source being tested is supplied not only to a resistance unit (electrode and electrolytic bath) but also to an electric device other than the resistance unit of the load testing device such as the compressor.

Therefore, it is possible to obtain hydrogen while performing a load test of the power source being tested by effectively using the power generated in the power source being tested without using an external power source other than the power source being tested.

More preferably, the load testing device further includes a breaker. An electrode of the hydrogen generating unit is electrically connected to the connection unit via the breaker. The compressor is electrically connected to the connection unit without passing through the breaker.

The supply of power to the resistance unit in the load testing device is performed via the breaker, and the supply of power to the electric device other than the resistance unit in the load testing device is performed without passing through the breaker.

Therefore, even after the breaker is turned off due to electric leakage or the like, the supply of power to the electric device other than the resistance unit is maintained, and the on state can be maintained.

Preferably, a pipe between the two or more supply units and the compressor is provided with a first sensor that detects a supply status of the hydrogen from the compressor to the two or more supply units. A degree of compression in the compressor is adjusted based on the information obtained by the first sensor.

Preferably, the two or more supply units are provided with a second sensor that detects a supply status of hydrogen to the portable tank attached to the supply unit. The display unit displays at least one of the attachment status of the portable tank and the hydrogen filling status in the two or more supply units on the basis of the information obtained by the second sensor.

Preferably, the supply unit includes a supply unit side opening portion and a supply unit side opening/closing portion. The supply unit side opening/closing portion brings the supply unit side opening portion into a closed state by an urging force, and brings the supply unit side opening portion into an open state by attaching the portable tank.

More preferably, the portable tank has a tank side opening portion and a tank side opening/closing portion. The tank side opening/closing portion brings the tank side opening portion into the closed state by the urging force, and brings the tank side opening portion into the open state by the pressure of hydrogen from the supply unit when attached to the supply unit.

More preferably, the tank side opening portion has an opening protrusion that is inserted into the supply unit via the supply unit side opening portion. The opening protrusion is provided with a hydrogen introduction unit which is formed of a hole or a notch and through which the hydrogen passes.

Preferably, the operational unit includes a switch for selecting an operation mode in which the load test of the power source being tested is performed and the electrolysis is performed and an operation mode in which the electrolysis is performed without performing the load test. A degree of cooling of a liquid to be electrolyzed is controlled based on the operational state of the switch.

Advantageous Effects of Invention

As described above, according to the present invention, it is possible to provide a load testing device capable of efficiently storing generated hydrogen.

BRIEF DESCRIPTION OF DRAWINGS

FIG. 4 is a cross-sectional configuration diagram of a portable tank and a hydrogen-using device before the portable tank is attached.

FIG. 5 is a cross-sectional configuration diagram of the portable tank and the hydrogen-using device after the portable tank is attached.

DESCRIPTION OF EMBODIMENTS

Hereinafter, the present embodiment will be described with reference to the drawings.

Note that the embodiment is not limited to the following embodiment. In addition, the contents described in one embodiment are similarly applied to other embodiments in principle. In addition, each embodiment and each modification can be appropriately combined.

Figure 1:
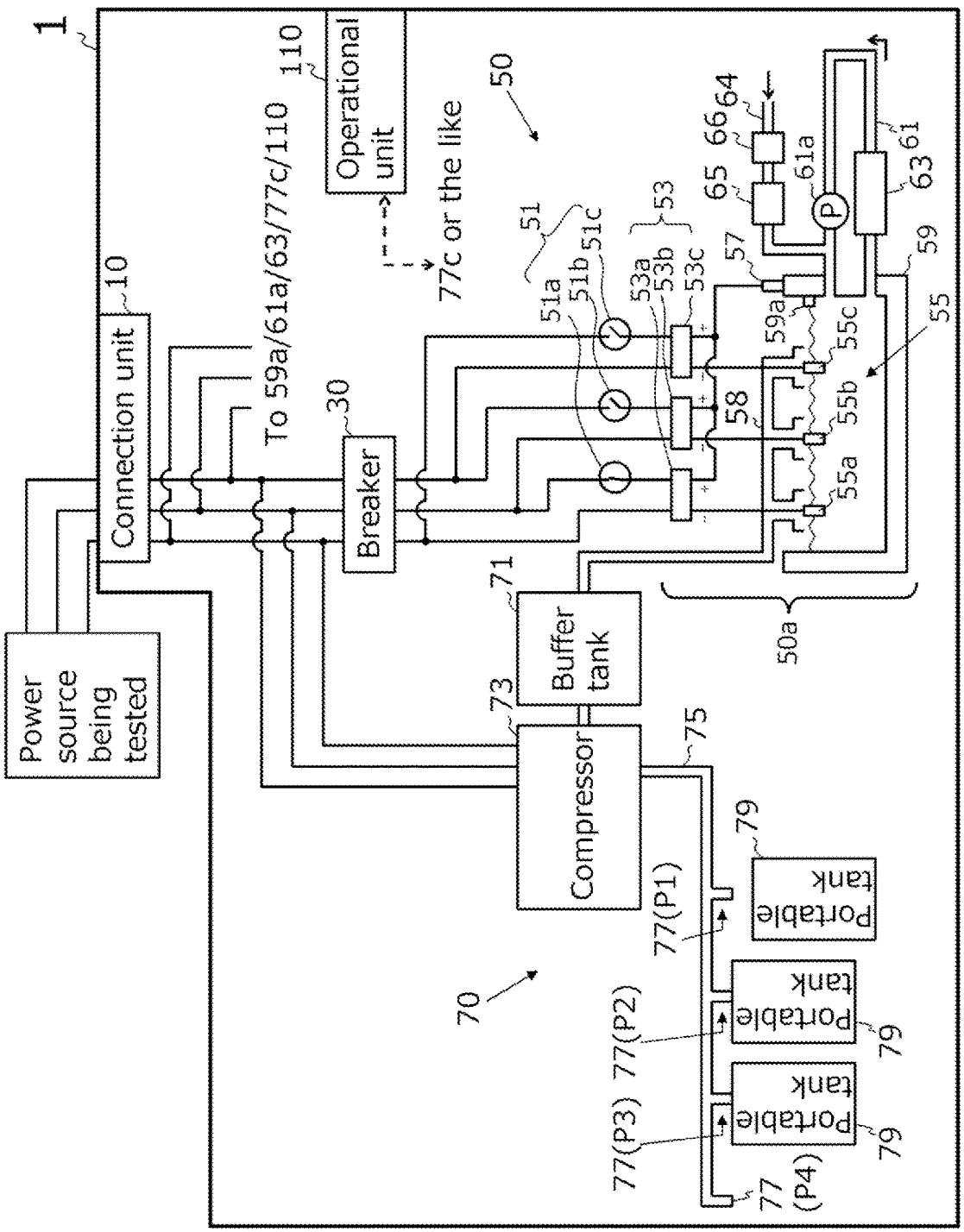
FIG. 1 is a schematic diagram illustrating a configuration of a load testing device according to the present embodiment.

A load testing device 1 according to the present embodiment includes a connection unit 10, a breaker 30, a hydrogen generating unit 50, a hydrogen storage unit 70, and an operational unit 110 (see FIG. 1).

(Connection Unit 10)

The connection unit 10 is connected to the breaker 30 and the like inside the load testing device 1, and is connected to the power source being tested outside the load testing device 1.

The power source being tested may be a device that supplies power to the load testing device 1, such as a generator or a battery.

In the present embodiment, the power source being tested is described as a three-phase AC generator, but may be another device that supplies power to the outside, such as a single-phase AC generator, a DC generator, or a battery.

Note that when DC power is supplied to the outside, such as a DC generator and a battery, a rectifying unit 53 may be omitted.

In the present embodiment, an example in which the power source being tested is a three-phase AC generator and the number of power lines from the power source being tested is three will be described. However, the power source being tested may include two power lines from the power source being tested, such as a single-phase AC generator, a DC generator, and a battery.

(Breaker 30)

The breaker 30 is composed of a molded case circuit breaker (MCCB), a vacuum circuit breaker (VCB), and the like, and is provided between the connection unit 10 and the hydrogen generating unit 50.

That is, a negative electrode 55 (a first negative electrode 55a to a third negative electrode) is electrically connected to the connection unit 10 via the breaker 30.

In the present embodiment, when the breaker 30 is in the on state, the power from the power source being tested is supplied to a resistance unit 50a of the hydrogen generating unit 50, and when the breaker 30 is in the off state, the supply of power from the power source being tested to the resistance unit 50a of the hydrogen generating unit 50 is stopped. However, when the breaker 30 is in the off state, the power from the power source being tested may be supplied to the resistance unit 50a of the hydrogen generating unit 50, and when the breaker 30 is in the on state, the supply of power from the power source being tested to the resistance unit 50a of the hydrogen generating unit 50 may be stopped.

An electrolytic-solution circulation circuit pump 61a and a cooler 63 of the hydrogen generating unit 50, a compressor 73, a first sensor 75a, and a second sensor 77c of the hydrogen storage unit 70, and an operational unit 110 are electrically connected to the connection unit 10 without passing through the breaker 30.

(Hydrogen Generating Unit 50)

The hydrogen generating unit 50 includes a switching unit 51 (a first relay 51a, a second relay 51b, and a third relay 51c), the rectifying unit 53 (a first AC/DC converter 53a, a second AC/DC converter 53b, and a third AC/DC converter 53c), the negative electrode 55 (the first negative electrode 55a, the second negative electrode 55b, and the third negative electrode 55c), a positive electrode 57, a hydrogen collecting member 58, an electrolytic bath 59, an electrolytic-solution circulation circuit 61, the electrolytic-solution circulation circuit pump 61a, the cooler 63, an electrolytic-solution introduction path 64, a pure water device 65, and a valve 66.

The hydrogen generating unit 50 performs electrolysis based on electric power supplied from the power source being tested to generate hydrogen.

The rectifying unit 53, the negative electrode 55, the positive electrode 57, the electrolytic bath 59, and the electrolytic solution in the electrolytic bath 59 constitute the resistance unit 50a of the hydrogen generating unit 50.

(Each Unit of Hydrogen Generating Unit 50)

Each unit of the hydrogen generating unit 50 will be described.

The switching unit 51 includes a plurality of relays (the first relay 51a to the third relay 51c).

The rectifying unit 53 includes a plurality of AC/DC converters (the first AC/DC converter 53a to the third AC/DC converter 53c).

A plurality of sets of relay and AC/DC converter are provided and connected in parallel with the power source being tested.

The negative electrode 55 (the first negative electrode 55a to the third negative electrode 55c) is connected to the negative electrode of each AC/DC converter of the rectifying unit 53, and the tip of each of said negative electrodes 55 is connected to the electrolytic solution in the electrolytic bath 59.

That is, the plurality of negative electrodes 55 (the first negative electrode 55a to the third negative electrode 55c) are connected in parallel to the power source being tested.

The positive electrode 57 is connected to the positive electrode of each AC/DC converter of the rectifying unit 53, and the tip of said positive electrode 57 is connected to the electrolytic bath 59 or connected to the electrolytic solution in the electrolytic bath 59.

The hydrogen collecting member 58 is made of a member having water resistance and heat resistance, such as an acrylic resin, covers upper portions of each of the first negative electrodes 55a to the third negative electrode 55c, and communicates with a buffer tank 71.

By the electrolysis of water, hydrogen is generated from the vicinity of the negative electrode 55, and oxygen is generated from the vicinity of the positive electrode 57.

The hydrogen generated from the vicinity of the negative electrode 55 is delivered to the buffer tank 71 via the hydrogen collecting member 58.

The oxygen generated from the vicinity of the positive electrode 57 is released into the atmosphere.

The electrolytic bath 59 is made of a conductive material such as stainless steel, and functions as an anode by being connected to the positive electrode 57.

The electrolytic bath 59 stores an electrolytic solution (aqueous solution containing 5% of sodium hydroxide) used for electrolysis.

The electrolytic solution is not limited to an aqueous solution containing sodium hydroxide, and may be an aqueous solution containing other substances such as potassium hydroxide.

The electrolytic bath 59 is provided with a water level/temperature sensor 59a that measures a water level and temperature of the electrolytic solution, and a degree of opening of the valve 66, a degree of cooling of the cooler 63, and the like described later are adjusted based on information from the water level/temperature sensor 59a so that a predetermined water level and a predetermined temperature are maintained.

Details of these adjustments will be described later.

The inside of the pipe forming the electrolytic-solution circulation circuit 61 is filled with the electrolytic solution, and the electrolytic solution circulates in the electrolytic-solution circulation circuit 61 including the electrolytic bath 59 via the electrolytic-solution circulation circuit pump 61a.

The electrolytic-solution circulation circuit 61 is provided with the cooler 63 such as a cooling tower or a radiator, and cools the electrolytic solution heated by the electrolysis.

An electrolytic-solution introduction path 64 for replenishing an electrolytic solution from the outside is connected to the electrolytic-solution circulation circuit 61 or the electrolytic bath 59.

The electrolytic-solution introduction path 64 is provided with the pure water device 65 for removing foreign matters of the supplied electrolytic solution and keeping the intrinsic resistance of the electrolytic solution constant, and the valve 66 for adjusting the supply amount of the electrolytic solution.

In the present embodiment, the mode in which three sets of the relay, the AC/DC converter, and the negative electrode are provided has been described, but the number of sets is not limited to three, and two sets or four or more sets may be provided in order to adjust the load amount of the load test.

In addition, although the mode in which the negative electrode 55 includes the plurality of electrodes (the first negative electrode 55a to the third negative electrode 55c) and the positive electrode 57 includes one electrode has been described, the mode in which the negative electrode 55 includes one electrode and the positive electrode 57 includes a plurality of electrodes may be adopted, or the mode in which each of the negative electrode 55 and the positive electrode 57 includes the plurality of electrodes may be adopted.

(Hydrogen Storage Unit 70)

The hydrogen storage unit 70 includes the buffer tank 71, the compressor 73, a pipe 75, a supply unit 77, and a portable tank 79.

(Each Part of Hydrogen Storage Unit 70)

Each part of hydrogen storage unit 70 will be described.

(Buffer Tank 71)

The buffer tank 71 temporarily stores hydrogen generated by electrolysis.

(Compressor 73)

The compressor 73 compresses hydrogen and feeds hydrogen into the portable tank 79 via the pipe 75 and the supply unit 77.

At least one of a front stage and a rear stage of the compressor 73 is provided with a dehumidifier (not illustrated) for drying hydrogen.

In the present embodiment, an example in which normal pressure hydrogen is generated from the electrolysis stack including the electrolytic bath 59 and high pressure hydrogen is generated using the compressor 73 will be described.

However, the high pressure hydrogen may be generated in the electrolytic stack.

In this case, the compressor 73 is omitted, and the dehumidifier is provided at a rear stage of the high pressure electrolysis stack.

(Pipe 75 and First Sensor 75a)

The pipe 75 communicates with the compressor 73 and the supply unit 77.

The pipe 75 includes the first sensor 75a.

The first sensor 75a detects a supply status of hydrogen from the compressor 73 to the supply unit 77.

For example, the first sensor 75a is a pressure sensor and is provided on an inner wall of the pipe 75.

The first sensor 75a detects information regarding pressure as the supply status of hydrogen from the compressor 73 to the supply unit 77, and transmits said information to the operational unit 110.

The information regarding the pressure detected by the first sensor 75a is output to a display unit 117 of the operational unit 110.

The degree of compression in the compressor 73 is adjusted based on the information regarding the pressure detected by the first sensor 75a.

For example, when the pressure detected by the first sensor 75a is smaller than a pressure threshold tp (for example, tp=35 MPa), the operation of the compressor 73 is controlled so that the degree of compression becomes high, and when the pressure is larger than the pressure threshold tp, the operation of the compressor 73 is controlled so that the degree of compression becomes low.

(Supply Unit 77)

The supply unit 77 communicates with the portable tank 79 in a detachable state.

Figure 2:
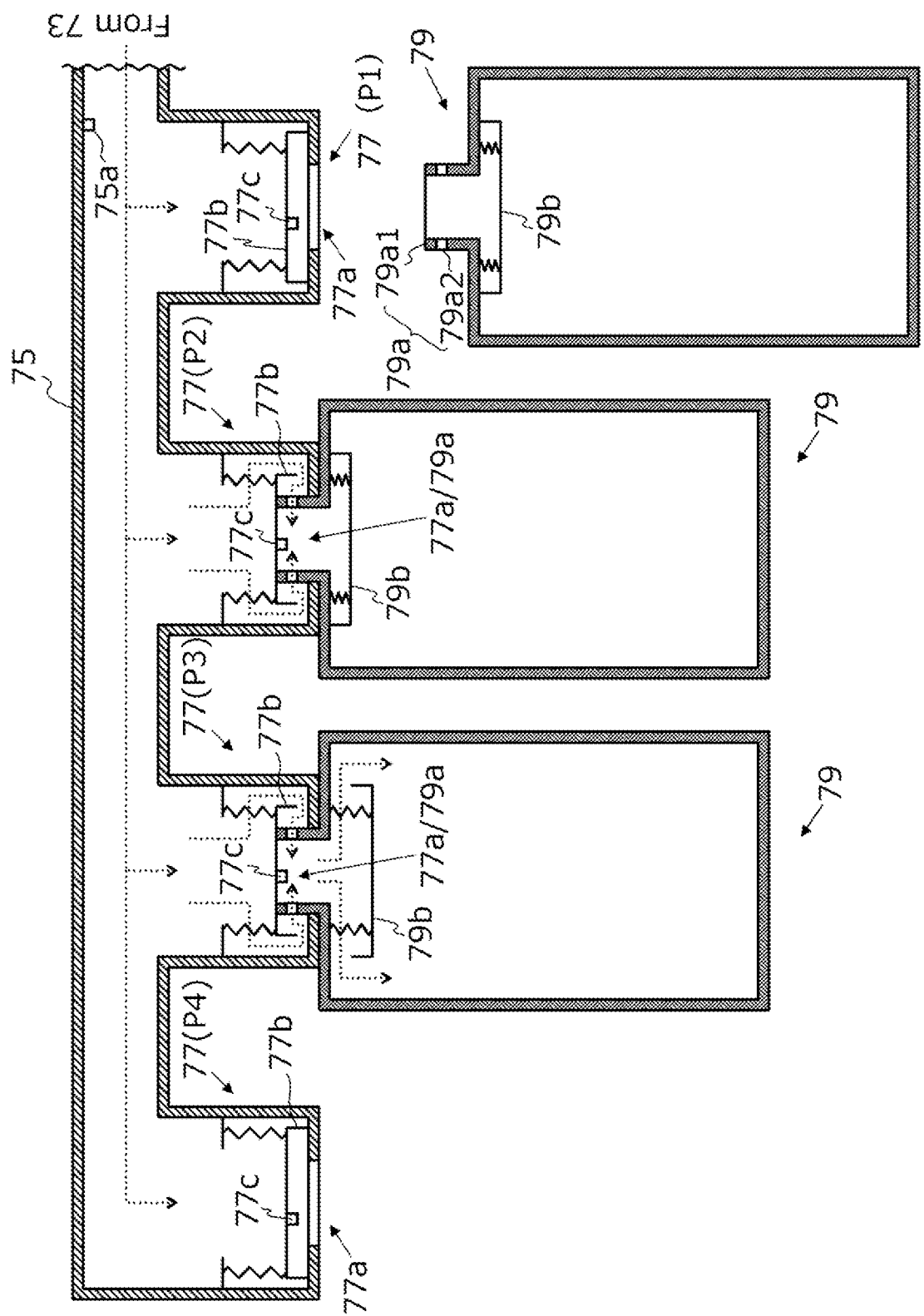
FIG. 2 is a cross-sectional configuration diagram of a supply unit and a portable tank.

A portion of the supply unit 77 which communicates with the portable tank 79 in the detachable state includes a supply unit side opening portion 77a, a supply unit side opening/closing portion 77b, and the second sensor 77c (see FIG. 2).

A plurality of the supply units 77 are provided.

In the present embodiment, an example is illustrated in which four supply units 77 are provided, and the portable tank 79 can be attached to each of the four supply units 77 at the same time.

However, the number of the supply units 77 is not limited to four.

In the present embodiment, the four supply units 77 will be described as a first port P1, a second port P2, a third port P3, and a fourth port P4 from a side closer to the compressor 73.

The supply unit side opening portion 77a is provided at an end portion of the supply unit 77 to which the portable tank 79 is attached.

The supply unit side opening/closing portion 77b brings the supply unit side opening portion 77a into the closed state by the urging force.

When the portable tank 79 is attached to the supply unit side opening/closing portion 77b and an opening protrusion 79a1 of the portable tank 79 is inserted into the supply unit side opening portion 77a, the supply unit side opening portion 77a is released from the closed state, and the supply unit side opening portion 77a is brought into the open state.

The second sensor 77c detects a supply status of hydrogen from the supply unit 77 to the portable tank 79.

For example, the second sensor 77c is a pressure sensor and is provided in the supply unit side opening/closing portion 77b.

Specifically, the second sensor 77c is provided in a region of the supply unit side opening/closing portion 77b. Said region is where the second sensor 77c is in contact with the atmosphere when the portable tank 79 is not attached to the supply unit 77. Said region is where hydrogen flows, when the portable tank 79 is attached to the supply unit 77 and when hydrogen can be supplied from the supply unit 77 to the portable tank 79.

In the present embodiment, an example will be described in which the second sensor 77c is provided at a position covered by the opening protrusion 79a1 of the portable tank 79 when the portable tank 79 is attached to the supply unit 77.

The second sensor 77c detects the information regarding pressure as the supply status of hydrogen from the supply unit 77 to the portable tank 79, and transmits said information to the operational unit 110.

The display unit 117 of the operational unit 110 displays the supply status or the like of hydrogen to the portable tank 79 in each port (the first port P1 to the fourth port P4) of the supply unit 77 on the basis of the information regarding the pressure detected by the second sensor 77c.

Figure 3:
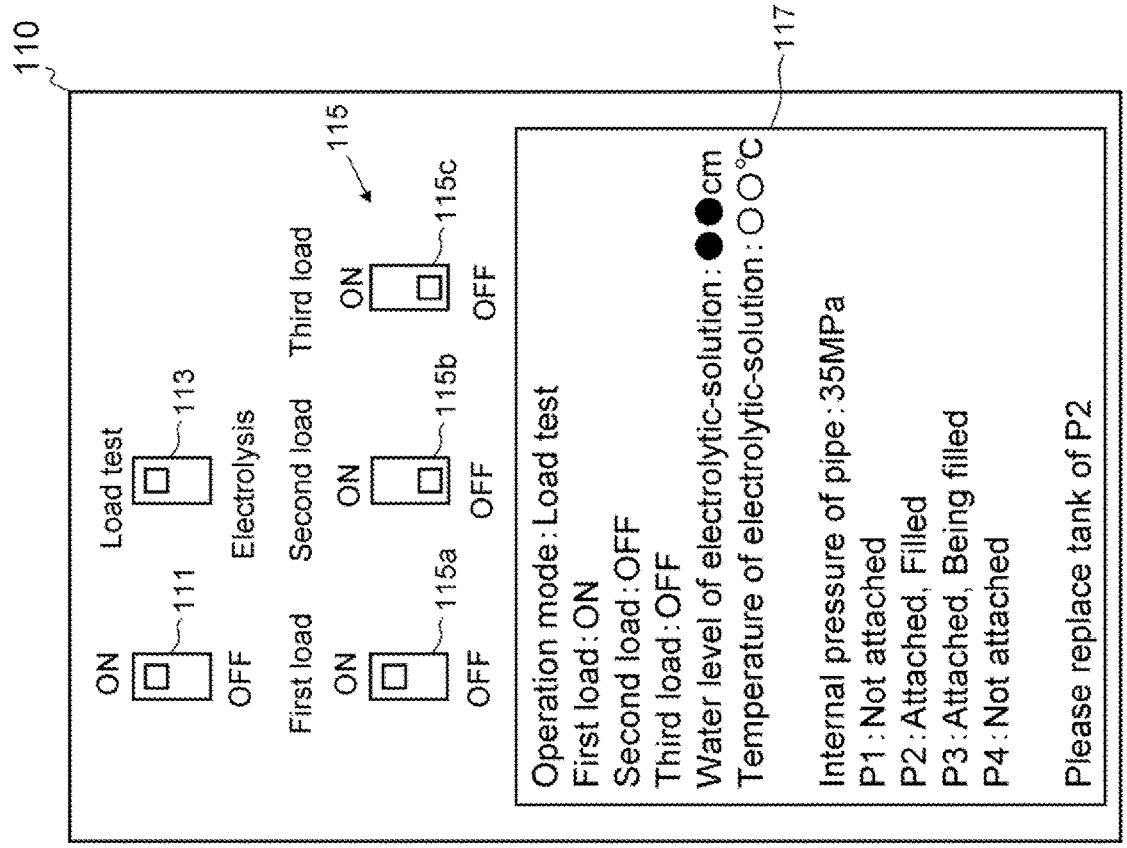
FIG. 3 is a configuration diagram of an operational unit.

For example, when the pressure detected by the second sensor 77c is close to the atmospheric pressure, it is assumed that the portable tank 79 is not attached to the supply unit 77, and the display unit 117 of the operational unit 110 displays "the portable tank 79 is not attached" (see FIG. 3).

In addition, in a case where the pressure detected by the second sensor 77c increases, it is assumed that the portable tank 79 is attached to the supply unit 77 and the portable tank 79 is filled with hydrogen from the supply unit 77, and the display unit 117 of the operational unit 110 displays "the portable tank 79 has been attached and is being filled with hydrogen".

In addition, in a case where the pressure detected by the second sensor 77c is maintained in a state close to the pressure threshold tp, it is assumed that the portable tank 79 is attached to the supply unit 77 and the filling of hydrogen from the supply unit 77 into the portable tank 79 is completed, the display unit 117 of the operational unit 110 displays "the portable tank 79 has been attached and the filling of hydrogen has been completed." and "an instruction to encourage replacement of the portable tank 79".

FIGS. 1 to 3 illustrate an example in which the first port P1 and the fourth port P4 are in a state in which the portable tank 79 is not attached, the second port P2 is in a state in which the portable tank 79 is attached and the filling of hydrogen is completed, and the third port P3 is in a state in which the portable tank 79 is attached and the filling of hydrogen is being performed.

In the present embodiment, the first sensor 75a and the second sensor 77c are described as pressure sensors, but may be other sensors that detect the supply status of hydrogen, for example, a flow rate sensor or the like.

(Portable Tank 79)

The portable tank 79 is a tank to be filled with hydrogen, and is removably attached to the supply unit 77.

The portable tank 79 has a tank side opening portion 79a and a tank side opening/closing portion 79b.

The tank side opening portion 79a has the opening protrusion 79a1 and a hydrogen introduction unit 79a2.

The opening protrusion 79a1 is a ring-shaped protrusion, and is inserted into the supply unit 77 through the supply unit side opening portion 77a at the time of attachment.

The hydrogen introduction unit 79a2 is provided in a portion of the opening protrusion 79a1 which is inserted into the supply unit side opening portion 77a.

The hydrogen introduction unit 79a2 is a hole or a notch for supplying hydrogen from the supply unit 77 to the portable tank 79 in a state where the supply unit side opening/closing portion 77b is in the open state.

The tank side opening/closing portion 79b brings the tank side opening portion 79a into the closed state by the urging force.

When attached to the supply unit 77, the tank side opening/closing portion 79b releases the closed state of the tank side opening portion 79a and brings the tank side opening portion 79a into the open state by the pressure of hydrogen from the supply unit 77.

However, in a case where the filling of the portable tank 79 with hydrogen has been completed and the internal pressure of the portable tank 79 is higher than the pressure of the supply unit 77, the tank side opening/closing portion 79b cannot be pushed away by the pressure of hydrogen, and thus the closed state of the tank side opening portion 79a is not released.

When the tank side opening/closing portion 79b is pressed in a state where the portable tank 79 is detached from the supply unit 77, the tank side opening portion 79a is brought into the open state, and hydrogen in the portable tank 79 is discharged to the outside.

Therefore, the apparatus (hydrogen-using device 81) that receives the supply of hydrogen filled in the portable tank 79 is provided with a hydrogen receiving side opening portion 81a, a hydrogen receiving side opening/closing portion 81b, and a pressing unit 81c (see FIG. 4).

The hydrogen-using device 81 receives supply of hydrogen from the portable tank 79 and performs power generation or the like using said hydrogen.

The hydrogen receiving side opening portion 81a is provided at an end of the hydrogen-using device 81 to which the portable tank 79 is attached.

When the portable tank 79 is attached and the opening protrusion 79a1 of the portable tank 79 is inserted into the hydrogen receiving side opening portion 81a, the hydrogen receiving side opening/closing portion 81b releases the closed state of the hydrogen receiving side opening portion 81a and brings the hydrogen receiving side opening portion 81a into the open state (see FIG. 5).

When the portable tank 79 is attached to the hydrogen-using device 81, the pressing unit 81c presses the tank side opening/closing portion 79b to bring the tank side opening portion 79a into the open state. As a result, hydrogen filled in the portable tank 79 flows into the hydrogen-using device 81.

In the hydrogen-using device 81 illustrated in FIGS. 4 and 5, only a region where the portable tank 79 is attached is illustrated, and illustration of devices at a rear stage is omitted.

The pressing unit 81c is attached to the hydrogen receiving side opening/closing portion 81b. That is, the pressing unit 81c is attached to the hydrogen receiving side opening/closing portion 81b in a movable state by the urged state of the hydrogen receiving side opening/closing portion 81b. However, the pressing unit 81c may be fixedly attached to a location (For example, an inner wall) different from the hydrogen receiving side opening/closing portion 81b of the hydrogen-using device 81.

(Operational Unit 110)

The operational unit 110 will be described.

The operational unit 110 includes an on/off switch 111, a mode switch 113, a load amount adjustment switch 115, and the display unit 117.

The operational unit 110 is provided on an outer wall of the load testing device 1.

As illustrated in FIG. 3, the switch region including the on/off switch 111, the mode switch 113, and the load amount adjustment switch 115, and the display unit 117 may be provided on the same surface of the outer wall or may be provided on different surfaces.

For example, it is conceivable that the switch region including the load amount adjustment switch 115 and the like is arranged on the front surface, and the display unit 117 is arranged on the side surface.

The on/off switch 111 is used to select either the on state or the off state of the entire load testing device 1.

When the on/off switch 111 is turned on by the user's operation, the breaker 30 is turned on, and power from the power source being tested can be supplied to the resistance unit 50a.

The mode switch 113 is used to select one of an operation mode in which the load test of the power source being tested is performed and the electrolysis is performed and an operation mode in which the electrolysis is performed without performing the load test.

When the load test mode is selected, the on/off state of the switching unit 51 (the first relay 51a to the third relay 51c) is controlled according to the operational state of the load amount adjustment switch 115, and the load amount is adjusted.

When the electrolysis mode is selected, the switching unit 51 (the first relay 51a to the third relay 51c) is turned on (the load amount does not change) regardless of the operational state of the load amount adjustment switch 115.

The load amount adjustment switch 115 (a first switch 115a, a second switch 115b, and a third switch 115c) is used to select the load amount in the load test mode.

The on/off states of the first relay 51a to the third relay 51c are switch-controlled corresponding to the on/off states of the first switch 115a to the third switch 115c.

The switch region of FIG. 3 displays a state in which the on/off switch 111 is turned on, the mode switch 113 is set to the load test mode. In addition, the switch region of FIG. 3 displays a state in which the load amount adjustment switch 115 is set to a state in which the first switch 115a corresponding to the first relay 51a is turned on, the second switch 115b corresponding to the second relay 51b is turned off, and the third switch 115c corresponding to the third relay 51c is turned off.

In this case, the power from the power source being tested is supplied to the first AC/DC converter 53a, and a current flows between the first negative electrode 55a and the positive electrode 57.

No power is supplied from the power source being tested to the second AC/DC converter 53b and the third AC/DC converter 53c, and no current flows between the second negative electrode 55b and the positive electrode 57 and between the third negative electrode 55c and the positive electrode 57.

The display unit 117 displays the water level of the electrolytic solution and the temperature of said electrolytic solution which are measured by the water level/temperature sensor 59a, the operational state of each switch, and the like.

In addition, the display unit 117 displays the pressure state of the pipe 75, the attachment status of the portable tank 79 to the supply unit 77, the filling status of hydrogen in the portable tank 79 attached to the supply unit 77, and the like.

The display unit 117 of FIG. 3 displays a state in which the mode switch 113 is set to the load test mode, the first switch 115a is set to the on state, the second switch 115b and the third switch 115c are set to the off state, the water level of the electrolytic solution is ●● cm, the temperature of the electrolytic solution is ○○° C., the internal pressure of the pipe 75 is 35 MPa, the portable tank 79 is not attached to the first port P1, the portable tank 79 is attached to the second port P2 and hydrogen is already filled, the portable tank 79 is attached to the third port P3 and hydrogen is being filled, and the portable tank 79 is not attached to the fourth port P4.

In addition, the display unit 117 of FIG. 3 displays a notification that the portable tank 79 attached to the second port P2 has been filled with hydrogen and that urges the replacement of the portable tank 79.

(Operation Procedure)

An operation procedure of the load testing device 1 according to the present embodiment will be described.

Some (at least one) of the supply units 77 are attached to the portable tank 79 in advance.

In the supply unit 77 to which the portable tank 79 is attached, the supply unit side opening/closing portion 77b is brought into the open state by the opening protrusion 79a1 of the portable tank 79.

Therefore, the portable tank 79 can be filled with hydrogen from the supply unit 77.

However, at this time, since the pressure of hydrogen flowing through the pipe 75 is not increased by the compressor 73, the tank side opening/closing portion 79b of the portable tank 79 is in the closed state, and the portable tank 79 is not filled with hydrogen.

In the supply unit 77 to which the portable tank 79 is not attached, the supply unit side opening/closing portion 77b is maintained in the closed state.

The power generated by the power source being tested is supplied to the water level/temperature sensor 59a, the electrolytic-solution circulation circuit pump 61a, the cooler 63, the compressor 73, the second sensor 77c, and the operational unit 110, via the connection unit 10.

As a result, each of the water level/temperature sensor 59a, the electrolytic-solution circulation circuit pump 61a, the cooler 63, the compressor 73, the second sensor 77c, and the operational unit 110 is turned on.

In addition, the power generated by the power source being tested is converted from alternating current to direct current via the connection unit 10, the breaker 30, the switching unit 51, and the rectifying unit 53, and is supplied to the electrolytic solution in the electrolytic bath 59.

As a result, electricity flows through the electrolytic solution via the negative electrode 55 connected to the electrolytic solution and the positive electrode 57 connected to the electrolytic bath 59, and thus, electrolysis of the electrolytic solution occurs.

Hydrogen is generated from the vicinity of the negative electrode 55 and collected in the buffer tank 71 via the hydrogen collecting member 58.

Oxygen is generated from the vicinity of the positive electrode 57 and released into the atmosphere.

The water level/temperature sensor 59a provided in the electrolytic bath 59 measures the water level and temperature of the electrolytic solution.

The display unit 117 displays the information regarding the water level and the temperature of the electrolytic solution.

The degree of opening of the valve 66, the degree of cooling of the cooler 63, and the like are adjusted based on the information from the water level/temperature sensor 59a. Accordingly, the predetermined water level and predetermined temperature are maintained.

However, the user may manually adjust the degree of opening of the valve 66, the degree of cooling of the cooler 63, and the like while viewing the water level and the temperature displayed on the display unit 117.

When the mode switch 113 is set to the load test mode and the load test of the power source being tested connected to the connection unit 10 of the load testing device 1 is performed, the on/off control of the first switch 115a to the third switch 115c corresponding to the first relay 51a to the third relay 51c is performed by the user.

In a case where many switches among the first switch 115a to the third switch 115c are turned on, the number of relays (the first relay 51a to the third relay 51c) to be turned on increases, and the load amount increases.

When the load test of the power source being tested connected to the connection unit 10 of the load testing device 1 is performed, the electrolytic solution is used as a load, and the degree of cooling of the cooler 63 is controlled such that the temperature of the electrolytic solution is maintained at a first temperature T1 in order to keep the electric resistance constant.

When the mode switch 113 is set to the electrolysis mode and the electrolysis is performed with the power obtained by the power source being tested connected to the connection unit 10 of the load testing device 1 without performing the load test, the first relay 51a to the third relay 51c are turned on so that the electrolysis is performed by all the negative electrodes 55.

In addition, in order to facilitate the flow of the current, it is preferable that the degree of cooling of the cooler 63 is controlled such that the temperature of the electrolytic solution is maintained at a second temperature T2 (T2>T1).

In this case, since the electrolysis of the electrolytic solution is easily performed, it is preferable to make the degree of opening of the valve 66 larger than that in the case of performing the load test so that the electrolytic solution for replenishment easily flows through the electrolytic-solution introduction path 64.

That is, the degree of cooling of the cooler 63, that is, the degree of cooling of the liquid (electrolytic solution, pure water, etc.) to be electrolyzed is controlled based on the operational state (is load test mode selected or electrolysis mode selected) of the mode switch 113.

This makes it possible to selectively use a mode in which the load amount is increased by increasing the electric resistance to perform the load test and a mode in which the electric resistance is decreased to increase the amount of hydrogen generated per unit time by electrolysis.

The compressor 73 compresses hydrogen stored in the buffer tank 71 and fills the portable tank 79 attached to the supply unit 77 with hydrogen in a high pressure state.

In the supply unit 77 to which the portable tank 79 is attached, the supply unit side opening/closing portion 77b is brought into the open state by the opening protrusion 79a1 of the portable tank 79.

Therefore, the portable tank 79 can be filled with hydrogen from the supply unit 77.

In the present embodiment, in the second port P2 and the third port P3, the portable tank 79 is attached to the supply unit 77, and hydrogen can be filled from the supply unit 77 into the portable tank 79.

The hydrogen brought into the high pressure state by the compressor 73 passes through the pipe 75 and the supply unit 77 to which the portable tank 79 is attached, and presses the tank side opening/closing portion 79b.

In a case where the pressure inside the portable tank 79 is lower than the pressure of the supply unit 77, the tank side opening/closing portion 79b is brought into the open state by the pressing force of hydrogen in the high pressure state, and hydrogen flows into the portable tank 79.

In a case where the pressure inside the portable tank 79 is equal to or higher than the pressure of the supply unit 77, the tank side opening/closing portion 79b cannot be brought into the open state by the pressure of hydrogen in the high pressure state, and the tank side opening/closing portion 79b is maintained in the closed state. In this case, hydrogen does not flow into the portable tank 79.

FIG. 2 illustrates a state in which the portable tank 79 attached to the supply unit 77 of the third port P3 is not sufficiently filled with hydrogen and hydrogen flows from the supply unit 77 into the portable tank 79.

In addition, a state in which the portable tank 79 attached to the supply unit 77 of the second port P2 is sufficiently filled with hydrogen and hydrogen does not flow from the supply unit 77 into the portable tank 79 is illustrated.

The first sensor 75a detects a supply status of hydrogen from the compressor 73 to the supply unit 77.

The information detected by the first sensor 75a is output to the display unit 117 of the operational unit 110.

Based on the information detected by the first sensor 75a, the degree of compression in the compressor 73 is adjusted such that the internal pressure of the pipe 75 is maintained at a predetermined pressure value (for example, a value near the pressure threshold tp).

The second sensor 77c detects a supply status of hydrogen from the supply unit 77 to the portable tank 79.

The display unit 117 of the operational unit 110 displays the supply status or the like of hydrogen to the portable tank 79 in each port (the first port P1 to the fourth port P4) of the supply unit 77 on the basis of the information regarding the pressure detected by the second sensor 77c.

(Effects)

In the present embodiment, it is possible to generate hydrogen and fill the portable tank 79 with hydrogen while performing the load test of the power source being tested.

A supply status of hydrogen such as a flow rate and a pressure in the pipe 75 upstream of the plurality of supply units 77, the attachment status of the portable tank 79 in the plurality of supply units 77, the filling status of hydrogen, and the like are output to the display unit 117 of the operational unit 110.

For this reason, a user can grasp information regarding these while operating the load test.

In addition, since the plurality of supply units 77 to which the portable tank 79 is removably attached is provided, it is possible to fill the plurality of portable tanks 79 with hydrogen at the same time. In addition, regarding the portable tank 79 attached to the supply unit 77, it is also possible to replace one portable tank 79 with a new portable tank 79 while filling hydrogen in another portable tank 79.

In addition, it is possible to fill a large capacity of hydrogen by using a plurality of portable tanks 79 having a small capacity.

When the capacity of the portable tank 79 is small, it is possible to easily manufacture the portable tank 79 having a specification conforming to the regulation as compared with the case of using the portable tank 79 having a large capacity.

Therefore, it is possible to efficiently fill the portable tank 79 with hydrogen generated in the load test.

Power supplied from the power source being tested is supplied not only to the resistance unit 50a but also to electric device other than the resistance unit 50a of the load testing device 1 such as the compressor 73.

Therefore, it is possible to obtain hydrogen while performing a load test of the power source being tested by effectively using the power generated in the power source being tested without using an external power source other than the power source being tested.

The supply of power to the resistance unit 50a in the load testing device 1 is performed via the breaker 30, and the supply of power to electric device other than the resistance unit 50a in the load testing device 1 is performed without passing through the breaker 30.

Therefore, even after the breaker 30 is turned off due to electric leakage or the like, the supply of power to the electric device other than the resistance unit 50a is maintained, and the on state can be maintained.

A partition wall formed of an ion exchange membrane or the like may be provided between the negative electrode 55 and the positive electrode 57 in the electrolytic bath 59 of the hydrogen generating unit 50 that performs the electrolysis.

An intermediate chamber may be provided between the partition wall on the negative electrode 55 side and the partition wall on the positive electrode 57 side.

A space between the negative electrode 55 and the positive electrode 57 may be formed of an electrolyte such as a polymer electrolyte membrane (PEM). In this case, the pure water is used without using the electrolytic solution.

Although some embodiments of the present invention have been described, these embodiments have been presented as examples, and are not intended to limit the scope of the invention. These embodiments can be implemented in various other forms, and various omissions, substitutions, and changes can be made without departing from the gist of the invention. These embodiments and modifications thereof are included in the scope and gist of the invention and are included in the invention described in the claims and the equivalent scope thereof.

REFERENCE SIGNS LIST

1 Load testing device
10 Connection unit
30 Breaker;
50 Hydrogen generating unit
50a Resistance unit
51 Switching unit
51a First relay
51b Second relay
51c Third relay
53 Rectifying unit
53a First AC/DC converter
53b Second AC/DC converter
53c Third AC/DC converter
55 Negative electrode
55a First negative electrode
55b Second negative electrode
55c Third negative electrode
57 Positive electrode
58 Hydrogen collecting member
59 Electrolytic bath
59a Water level/temperature sensor
61 Electrolytic-solution circulation circuit
61a Electrolytic-solution circulation circuit pump
63 Cooler
64 Electrolytic-solution introduction path
65 Pure water device
66 Valve
70 Hydrogen storage unit
71 Buffer tank
73 Compressor
75 Pipe
75a First sensor
77 Supply unit
77a Supply unit side opening portion
77b Supply unit side opening/closing portion
77c Second sensor
79 Portable tank
79a Tank side opening portion
79a1 Opening protrusion
79a2 Hydrogen introduction unit
79b Tank side opening/closing portion
81 Hydrogen-using device
81a Hydrogen receiving side opening portion
81b Hydrogen receiving side opening/closing portion
81c Pressing unit
110 Operational unit
111 On/off switch
113 Mode switch
115 Load amount adjustment switch
115a to 115c First switch to third switch
117 Display unit
P1 First port
P2 Second port
P3 Third port
P4 Fourth port
T1 First temperature
T2 Second temperature
Tp Pressure threshold

The invention claimed is:

1. A load testing device, comprising:
a connector to which a power source being tested is connected;
a hydrogen generator that performs electrolysis based on power supplied from the power source being tested to generate hydrogen;
two or more ports to which hydrogen obtained in the hydrogen generator passes and to which a portable tank is removably attached;
a load amount adjustment switch; and
a display,
wherein the load amount of the hydrogen generator is switched depending on an operational state of the load amount adjustment switch, and the display displays at least one of an attachment status of the portable tank and a filling status of hydrogen in the two or more ports.

2. The load testing device according to claim 1, further comprising:
a compressor that operates based on power from the power source being tested and compresses the hydrogen obtained in the hydrogen generator,
wherein the hydrogen made to a high pressure state by the compressor is supplied to the two or more ports.

3. The load testing device according to claim 2, further comprising:
a breaker,
wherein an electrode of the hydrogen generator is electrically connected to the connector via the breaker, and
the compressor is electrically connected to the connector without passing through the breaker.

4. The load testing device according to claim 2, wherein a pipe between the two or more ports and the compressor is provided with a first sensor that detects a supply status of the hydrogen from the compressor to the two or more ports, and
a degree of compression in the compressor is adjusted based on the information obtained by the first sensor.

5. The load testing device according to claim 1, wherein the two or more ports are provided with a second sensor that detects a supply status of the hydrogen to the portable tank attached to the port, and
the display displays at least one of the attachment status of the portable tank and the hydrogen filling status in the two or more ports on the basis of the information obtained by the second sensor.

6. The load testing device according to claim 1, wherein the port includes a port side opening portion and a port side opening/closing portion, and
the port side opening/closing portion brings the port side opening portion into a closed state by an urging force, and brings the port side opening portion into an open state by attaching the portable tank.

7. The load testing device according to claim 6, wherein the portable tank has a tank side opening portion and a tank side opening/closing portion, and
the tank side opening/closing portion brings the tank side opening portion into a closed state by the urging force, and brings the tank side opening portion into an open state by the pressure of hydrogen from the port when attached to the port.

8. The load testing device according to claim 7, wherein the tank side opening portion has an opening protrusion that is inserted into the port via the port side opening portion, and
the opening protrusion is provided with a hydrogen introduction unit which is formed of a hole or a notch and through which the hydrogen passes.

9. The load testing device according to claim 1, further comprising:
a selection switch for selecting an operation mode in which the load test of the power source being tested is performed and the electrolysis is performed, and an operation mode in which the electrolysis is performed without performing the load test,
wherein a degree of cooling of a liquid to be electrolyzed is controlled based on the operational state of the selection switch.

* * * * *